United States Patent
Padhye et al.

(10) Patent No.: US 7,183,825 B2
(45) Date of Patent: Feb. 27, 2007

(54) STATE RETENTION WITHIN A DATA PROCESSING SYSTEM

(75) Inventors: Milind P. Padhye, Austin, TX (US); Christopher K. Y. Chun, Austin, TX (US); Yuan Yuan, Austin, TX (US); Sanjay Gupta, Delhi (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/818,861

(22) Filed: Apr. 6, 2004

(65) Prior Publication Data

US 2005/0218952 A1    Oct. 6, 2005

(51) Int. Cl.
  *H03K 3/289*    (2006.01)
(52) U.S. Cl. ............... 327/202; 327/203; 327/204; 327/206; 327/218
(58) Field of Classification Search ........ 327/202, 327/203, 204, 205, 206, 207
  See application file for complete search history.

(56) References Cited

U.S. PATENT DOCUMENTS

| | | | |
|---|---|---|---|
| 5,162,667 A | 11/1992 | Yasui et al. | 327/203 |
| 5,982,211 A * | 11/1999 | Ko | 327/202 |
| 6,141,237 A | 10/2000 | Eliason et al. | 365/145 |
| 6,195,754 B1 | 2/2001 | Jardine et al. | 713/324 |
| 6,362,675 B1 | 3/2002 | Alwais | 327/218 |
| 6,433,586 B2 * | 8/2002 | Ooishi | 326/93 |
| 6,538,471 B1 * | 3/2003 | Stan et al. | 326/46 |
| 6,870,412 B2 * | 3/2005 | Cho | 327/202 |
| 6,947,310 B1 * | 9/2005 | Marshall et al. | 365/145 |
| 2002/0159305 A1 | 10/2002 | Yoo et al. | |
| 2003/0067322 A1 | 4/2003 | Stan et al. | |

FOREIGN PATENT DOCUMENTS

EP    1 098 324 A2    5/2001

OTHER PUBLICATIONS

Zyuban, Victor et al.; "Low Power Integrated Scan-Retention Mechanism"; ISLPED '02; Aug. 12-14, 2002; pp. 98-102; ACM (18 page related presentation included).
Shigematsu, Satoshi et al.; "A 1-V High-Speed MTCMOS Circuit Scheme for Power-Down Application Circuits"; IEEE Journal of Solid-State Circuits; Jun. 1997; pp. 861-869; vol. 32, No. 6; IEEE.

(Continued)

*Primary Examiner*—Tuan T. Lam
*Assistant Examiner*—Hiep Nguyen
(74) *Attorney, Agent, or Firm*—Joanna G. Chiu; Michael P. Noonan

(57) ABSTRACT

Power consumption may be reduced through the use of power gating in which power is removed from circuit blocks or portions of circuit blocks in order to reduce leakage current. One embodiment uses a modified state retention flip-flop capable of retaining state when power is removed or partially removed from the circuit. Another embodiment uses a modified state retention buffer capable of retaining state when power is removed or partially removed from the circuit. The state retention flip-flop and buffer may be used to allow for state retention while still reducing leakage current. Also disclosed are various methods of reducing power and retaining state using, for example, the state retention flip-flops and buffers. For example, software, hardware, or a combination of software and hardware methods may be used to enter a deep sleep or idle mode while retaining state.

20 Claims, 8 Drawing Sheets

OTHER PUBLICATIONS

Levy, Paul S. et al. "Power-Down Integrated Circuit Cuilt-In Self-Test Structures"; 1991 IEEE VLSI Test Symposium; 1991; IEEE.

Padhye, filed concurrently.
PCT application PCT/EP03/00435, Chun, filed Jan. 17, 2003.

* cited by examiner

| PG | SCLK | SWITCH 208 | SWITCH 210 | SWITCH 216 | SWITCH 218 |
|---|---|---|---|---|---|
| 0 | 0 | ON | OFF | OFF | ON |
| 0 | 1 | OFF | ON | ON | OFF |
| 1 | X | ON | OFF | OFF | ON |

*FIG. 3*

| PG | SCLK | SWITCH 208 | SWITCH 210 | SWITCH 216 | SWITCH 218 |
|---|---|---|---|---|---|
| 0 | 0 | OFF | ON | ON | OFF |
| 0 | 1 | ON | OFF | OFF | ON |
| 1 | X | OFF | ON | ON | OFF |

*FIG. 4*

| PG | SCLK | SWITCH 208 | SWITCH 210 | SWITCH 216 | SWITCH 218 |
|---|---|---|---|---|---|
| 0 | 0 | ON | OFF | OFF | ON |
| 0 | 1 | OFF | ON | ON | OFF |
| 1 | X | OFF | ON | OFF | ON |

*FIG. 5*

| | | VDD1 (MASTER 202) | VDD2 (SLAVE 204) |
|---|---|---|---|
| SLEEP DOMAIN | POSEDGE FF | VDD | VDDC |
| | NEGEDGE FF | VDDC | VDD |
| | UNKNOWN STATE FF | VDDC | VDDC |
| RUN DOMAIN | ANY FF | VDDC | VDDC |

*FIG. 6*

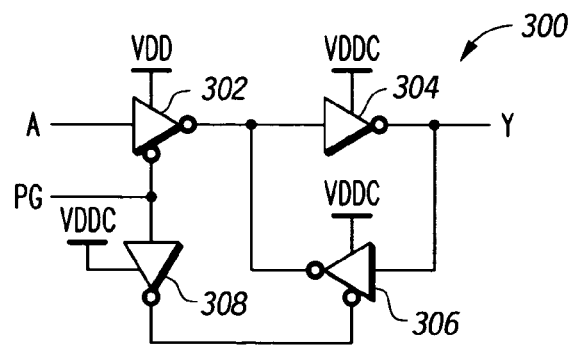
*FIG. 7*      *FIG. 8*
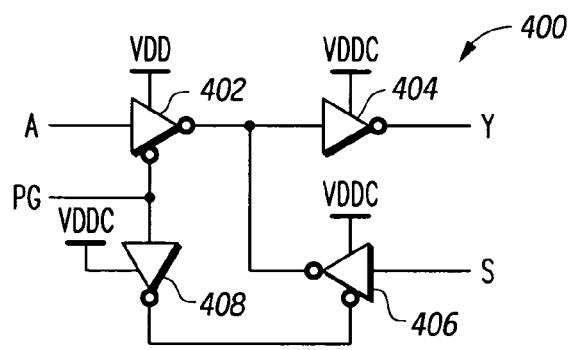
*FIG. 9*      *FIG. 10*

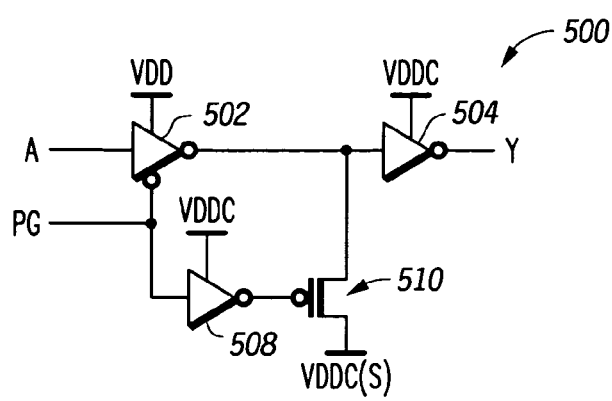
*FIG. 14*
| PG | A | Y |
|---|---|---|
| 0 | 1 | 1 |
| 0 | 0 | 0 |
| 1 | X | 0 |
*FIG. 15*
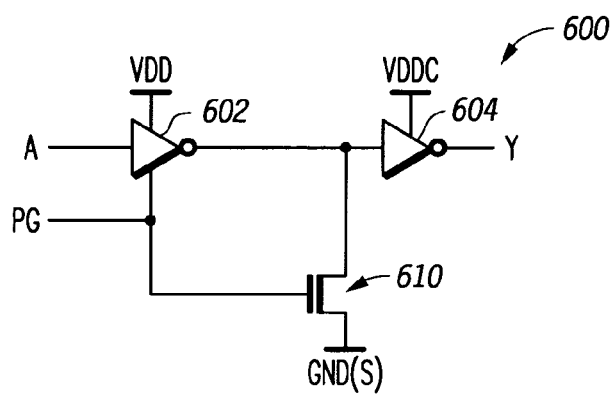
*FIG. 16*
| PG | A | Y |
|---|---|---|
| 0 | 1 | 1 |
| 0 | 0 | 0 |
| 1 | X | 1 |
*FIG. 17*

STATE RETENTION WITHIN A DATA PROCESSING SYSTEM

FIELD OF THE INVENTION

The present invention relates generally to data processing systems, and more specifically, to state retention within a data processing system.

RELATED ART

Lower power consumption has been gaining importance in data processing systems, due, for example, to wide spread use of portable and handheld applications. For example, for handheld devices, battery life is a very important parameter. Handheld devices are typically off (e.g., in an idle or deep sleep mode) for a significant portion of time, consuming only leakage power. Therefore, reducing leakage current is becoming an increasingly important factor in extending battery life.

One method of reducing leakage current of the devices is to increase the threshold voltage. However, simply increasing the threshold voltage of a devices may result in unwanted consequences such as slowing the device down and limiting circuit performance.

Another method of reducing leakage current is to power gate, or cut off power to certain blocks. However, in doing so, the state of the circuit blocks is lost. In many circuit blocks, though, state retention is needed in order to prevent loss of important information and allow for proper circuit operation and performance. Therefore, a need exists for improved circuitry and methods for state retention during, for example, idle or deep sleep modes, which may therefore help in reducing leakage power and extending battery life.

BRIEF DESCRIPTION OF THE DRAWINGS

The present invention is illustrated by way of example and not limited by the accompanying figures, in which like references indicate similar elements, and in which:

FIGS. 3–6 illustrate tables corresponding to operation of various embodiments of state retention flip-flops, such as the state retention flip-flop of FIG. 2, in accordance with various embodiments of the present invention;

FIG. 7 illustrates, in schematic form, a state retention buffer in accordance with one embodiment of the present invention;

FIG. 8 illustrates a table corresponding to operation of the state retention buffer of FIG. 7, in accordance with one embodiment of the present invention;

FIG. 9 illustrates, in schematic form, a state retention buffer in accordance with another embodiment of the present invention;

FIG. 10 illustrates a table corresponding to operation of the state retention buffer of FIG. 9, in accordance with one embodiment of the present invention;

FIG. 14 illustrates, in schematic form, a state retention buffer in accordance with another embodiment of the present invention;

FIG. 15 illustrates a table corresponding to operation of the state retention buffer of FIG. 14, in accordance with one embodiment of the present invention;

FIG. 16 illustrates, in schematic form, a state retention buffer in accordance with another embodiment of the present invention; and FIG. 17 illustrates a table corresponding to operation of the state retention buffer of FIG. 16, in accordance with one embodiment of the present invention.

Figure 1:
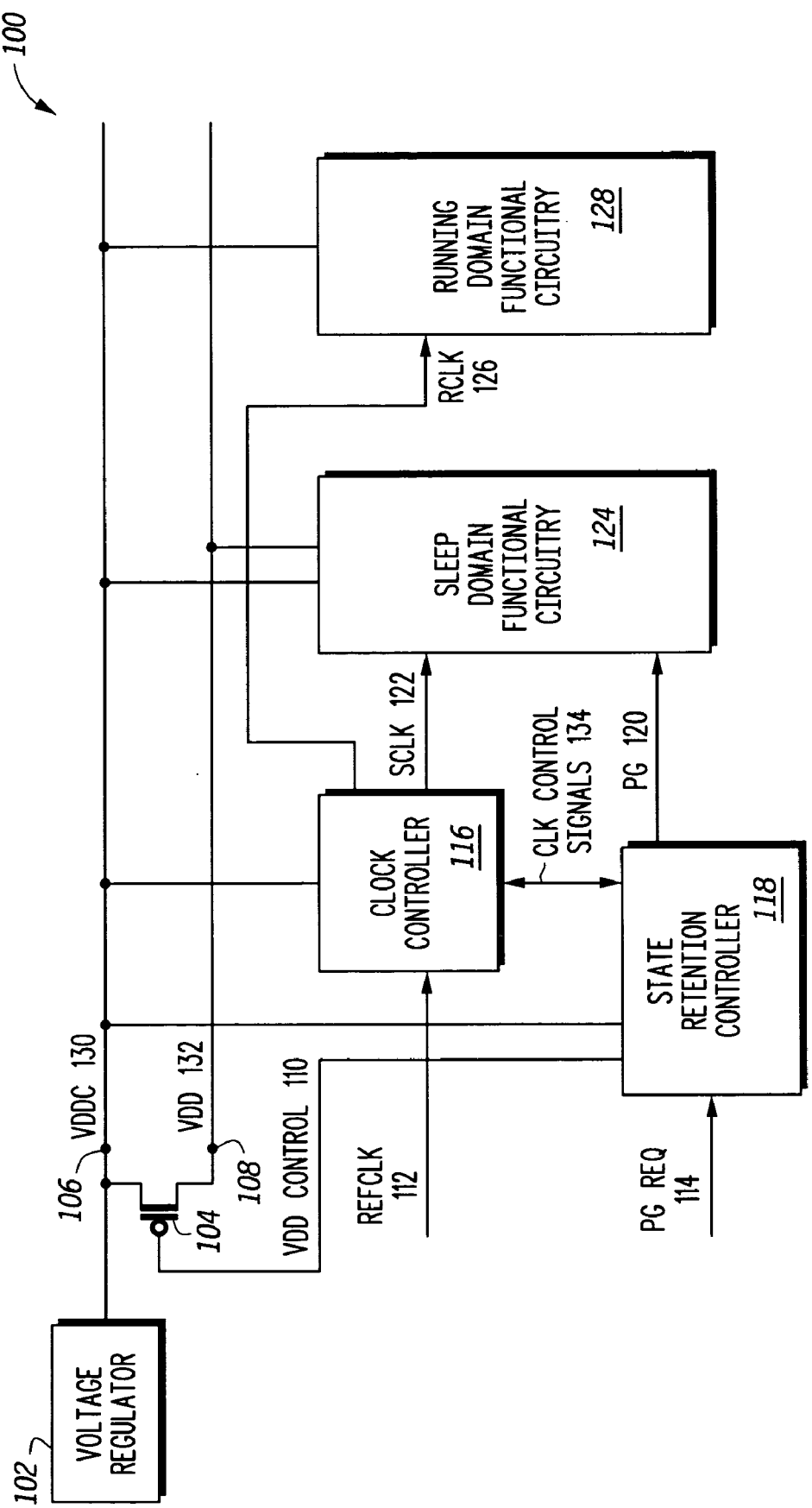
FIG. 1 illustrates, in block diagram form, a data processing system in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one. Therefore, each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, those signals described as positive logic signals may be implemented as negative logic signals, and those signals described as negative logic signals may be implemented as positive logic signals.

As will be discussed herein, power consumption may be reduced through the use of power gating in which power is removed from circuit blocks or portions of circuit blocks in order to reduce leakage current. One embodiment uses a modified state retention flip-flop capable of retaining state when power is removed or partially removed from the circuit. Another embodiment uses a modified state retention buffer capable of retaining state when power is removed or partially removed from the circuit. The state retention flip-flop and buffer, as will be described below, allow for state retention with minimal additional circuitry while still reducing leakage current. Also described herein are various methods of reducing power and retaining state using, for example, the state retention flip-flops and buffers. For example, one embodiment uses a hardware method to enter a deep sleep mode and retain state while another embodiment uses a combination of hardware and software to enter a deep sleep mode and retain state.

FIG. 1 illustrates a data processing system 100 in accordance with one embodiment of the present invention. Data processing system 100 includes a voltage regulator 102, a transistor 104, a clock controller 116, a state retention controller 118, sleep domain functional circuitry 124, and running domain functional circuitry 128. Voltage regulator 102 provides continuous VDD (VDDC) 130 and VDD 132 wherein VDDC 130 and VDD 132 are coupled via transistor 104. That is, a first current electrode of transistor 104 is coupled to VDDC 130 and a second current electrode of transistor 104 is coupled to VDD 132. A control electrode of transistor 104 is coupled to receive a power gate control signal (VDD control 110) from state retention controller 118. In the illustrated embodiment, transistor 104 is a PMOS transistor. VDDC 130 is provided to state retention controller 118, clock controller 116, sleep domain functional circuitry 124, and running domain functional circuitry 128. VDD 132 is provided to sleep domain functional circuitry 124. Clock controller 116 receives a reference clock, refclk 112, provides a sleep domain clock, sclk 122, to sleep domain functional circuitry 124 and a running domain clock, rclk 126, to running domain functional circuitry 128, and communicates with state retention controller 118 via bidirectional clk control signals 134. State retention controller 118 receives a power gate request (PG req 114) and provides a power gate indicator signal (PG 120) to sleep domain functional circuitry 124. Note that data processing system 100 may be located all on a same integrated circuit, or, alternatively, data processing system 100 may be located on any number of integrated circuits or may be implemented with both integrated circuit elements and discrete circuit elements. Data processing system 100 may be any type of data processing system, such as, for example, a microprocessor, digital signal processor, etc., or any type of information processing system. Also note that in the illustrated embodiment of data processing system 100, signals such as VDD control 110, PG 120, and PG req 114 are described as positive logic signals.

In operation, data processing system 100 includes VDDC 130 (which may also be referred to as a continuous power supply signal) and VDD 132 (which may also be referred to as a gated power supply signal) to provide power to various portions of data processing system 100. In the illustrated embodiment, VDDC 130 is generated by voltage regulator 102, as known in the art, such that VDDC 130 is a controllably regulated power supply signal. When VDD 132 is coupled to VDDC 130 (via transistor 104, when VDD control 110 is a logic level 0), then VDD 132 is approximately the same as VDDC 130, and both provide power to portions of data processing system 100. When VDD control 110 is a logic level 1, then VDD 132 is decoupled from VDDC 130, such that only VDDC 130 provides power to portions of data processing system 100, thus power gating VDD 132 (i.e. removing power to those portions of circuitry coupled to VDD 132). Note that in alternate embodiments, different circuitry may be used to implement the functionality of transistor 104 such that, depending on VDD control 110, either both VDDC 130 and VDD 132 provide power to data processing system 100, or VDDC 130, but not VDD 132, provides power to data processing system 100. For example, other switching elements or gate circuits may be used, or any combination of elements may be used.

In the illustrated embodiment, data processing system 100 includes both sleep domain functional circuitry 124 and running domain functional circuitry 128. Sleep domain functional circuitry 124 includes circuitry whose clocks may be removed during low power modes such as when data processing system 100 is in a deep sleep mode or is in an idle mode. During those times when the clocks (e.g. SCLK 122) are off, power may also be removed from portions of the circuitry to help reduce leakage current. For example, in the illustrated embodiment, sleep domain functional circuitry receives both VDDC 130 and VDD 132, wherein, during normal or full power operation, VDD control 110 is set to a logic level 0 by state retention controller 118 in order to couple VDD 132 to VDDC 130. Therefore, during normal or full power operation, both VDDC 130 and VDD 132 provide power to sleep domain circuitry 124. However, during a low power mode (with, for example, sclk 122 turned off), VDD control 110 may be set to a logic level one in order to decouple VDD 132 from VDDC 130, thus gating off VDD 132. In this case, only portions of sleep domain functional circuitry 124 (those portions which, for example, retain state information) are powered by VDDC 130 while the remaining portions which are coupled to VDD 132 are powered down. As will be described below, sleep domain functional circuitry 124 may include modified flip-flops and buffers which, in combination with VDDC 130, may be used to retain state within sleep domain functional circuitry 124.

Running domain functional circuitry 128 includes circuitry which may not be placed in a deep sleep mode and therefore continuously receives a clock (e.g. rclk 126) and power (VDDC 130). This circuitry may include, for example, a real time clock that needs to constantly remain powered, or other circuitry such as a deep sleep module (which can periodically wake up data processing system 100 to check for activity, such as, for example, calls or messages), an interrupt buffer (which detects activity, such as, for example, key presses), and other blocks which monitor data processing system 100 or provide critical functions which should not be turned off. This circuitry may therefore include non state-retentive devices, such as non state-retentive flip-flops and buffers (which may operate as normal flip-flops and buffers as known in the art today). In one embodiment, rclk 126 is a continuous clock which is not turned off during a low power mode. In one embodiment, rclk 126 is a slower clock than sclk 122 (where rclk 126 may be, for example, a 32 kHz clock, and sclk 122 may be, for example, a 13 MHz clock). Therefore, unlike sclk 122 which may be turned on or off, rclk 126 is typically not turned off. Since running domain functional circuitry 128 is continuously running, it remains continuously powered, and thus receives only VDDC 130 since its power will not be gated, unlike those portions of sleep domain functional circuitry 124 which receive VDD 132.

Although FIG. 1 has been illustrated as having two distinct functional circuitry blocks, it should be understood that data processing system 100 may include any number of sleep domain circuitry regions and running domain circuitry regions. For example, in one embodiment, sleep domain circuitry and running domain circuitry are not physically separate blocks, but instead are integrated with each other, receiving sclk 122, rclk 126, VDD 130, and VDDC 132, as needed. Also note that the circuitry within sleep domain functional circuitry 124 and running domain functional circuitry 128 may include any type of circuitry to perform any type of function, as needed by data processing system 100. Also, in alternate embodiments, data processing system 100 may include any number and type of power domain circuitries (in addition to the sleep and running domain functional circuitries). Therefore, data processing system 100 may be designed in a variety of different ways for a variety of different applications. The functional circuitry of data processing system 100 will therefore not be discussed in more detail herein except to the extent necessary to describe operation of the state retention portions.

Clock controller 116 generates sclk 122 and rclk 126, as needed, based on refclk 112. In one embodiment, refclk 112 is generated by a crystal oscillator which may be located on a same integrated circuit as data processing system 100 or external to data processing system 100. Therefore, based on controls from state retention controller 118 (via, for example, clk control signals 134) and control information from other power management modules (not shown), if present, clock controller 116 is able to turn off sclk 122 or otherwise modify sclk 122 and rclk 126, as needed. Note that clock controller 116 receives VDDC 130 so that it may continue to control sclk 122 and rclk 126 as needed, even during low power modes.

State retention controller 118 may be used to ensure that state is properly retained when entering a low power mode such as a deep sleep mode or idle mode. For example, in the illustrated embodiment, state retention controller 118 receives a PG req 114. This request can be a signal generated from a power management module (not shown) or any other circuitry within data processing system 100 which indicates to state retention controller 118 when power gating is needed. PG req 114 can also correspond to a value stored in memory (such as, for example, a bit) that is controllable by software running on data processing system 100. Alternatively, PG req 114 may be received from a source external to data processing system 100. In response to receiving PG req 114, state retention controller 118, via clk control signals 134, indicates to clock controller 116 that sclk 122 is to be shut down in order to enter a low power mode in which the power will be gated off to portions of sleep domain functional circuitry 124. State retention controller 118 also indicates to sleep domain functional circuitry 124, via PG 120, that power gating is to be performed. Therefore, in one embodiment, state retention controller 118, in response to receiving acknowledgement from clock controller 116 that sclk 122 has been turned off (or, after a predetermined amount of time after indicating to clock controller 116 that sclk 122 is to be turned off), may assert PG 120 such that portions of sleep domain functional circuitry 124 may be powered down and may also set VDD control 110 to a logic level one to decouple VDD 132 from VDDC 130. Operation of clock controller 116 and state retention controller 118 will be described in more detail below in reference to the timing diagrams of FIGS. 11–12 and the flow diagram of FIG. 13.

Figure 2:
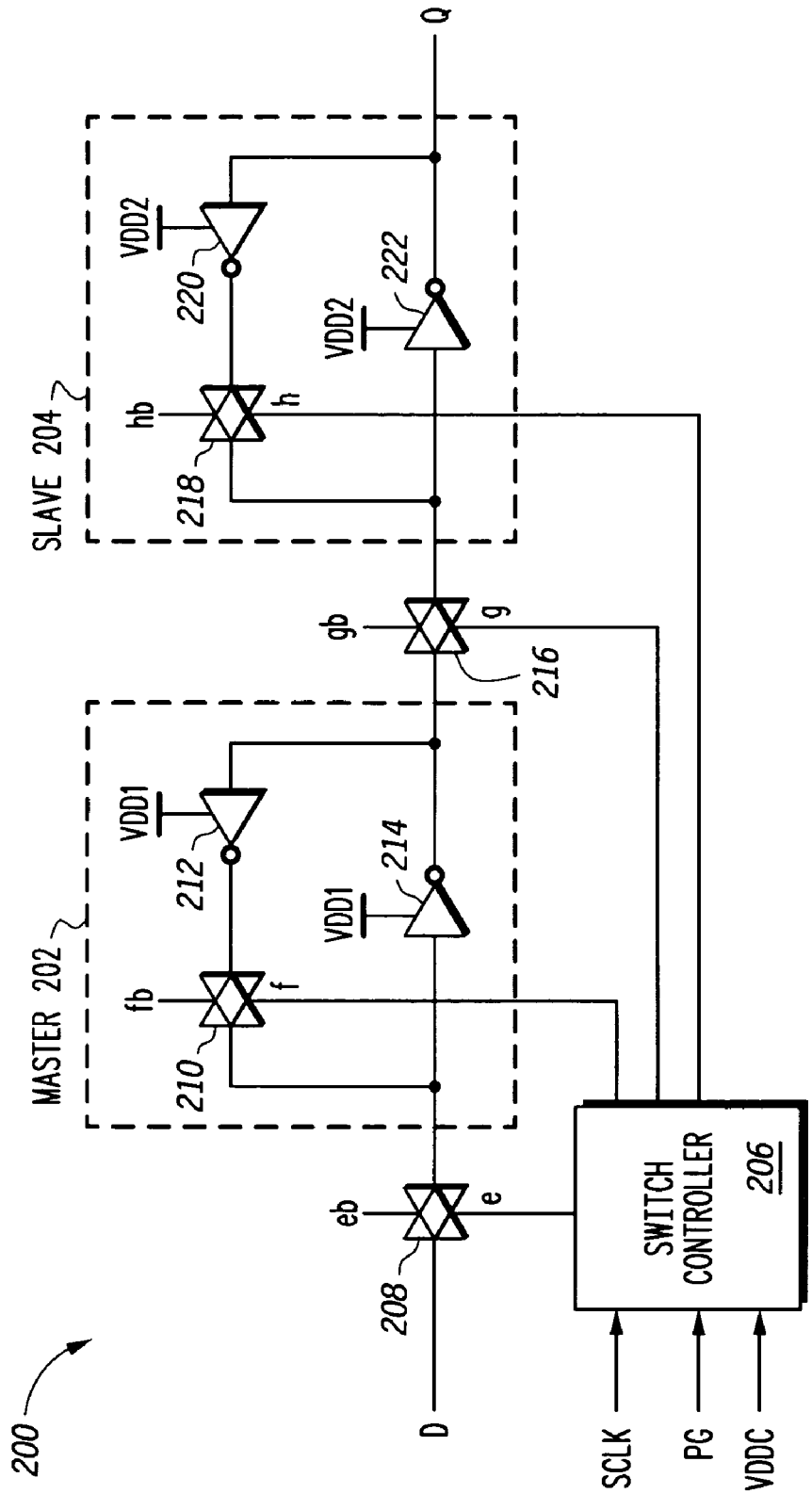
FIG. 2 illustrates, in partial block diagram form and partial schematic form, a state retention flip-flop in accordance with one embodiment of the present invention.

FIG. 2 illustrates one embodiment of a state retention flip-flop 200 (which may also be referred to as state-retentive flip-flop 200). In the illustrated embodiment, flip-flop 200 is a master-slave flip-flop which includes a master portion 202 coupled to slave portion 204. Flip-flop 200 includes a switch 208 having a first terminal coupled to receive an input, D, and a second terminal coupled to a first terminal of a switch 210 and an input to an inverter 214. Switch 208 has a first control terminal which receives e and a second control terminal which receives eb (the inverse of e). Switch 210 has a second terminal coupled to an output of inverter 212, a first control terminal which receives f, and a second terminal which receives fb (the inverse of f). An output of inverter 214 and an input of inverter 212 are coupled to a first terminal of a switch 216. A first control terminal of switch 216 receives g and a second control terminal of switch 216 receives gb (the inverse of g). A second terminal of switch 216 is coupled to a first terminal of a switch 218 and an input of an inverter 222. A first control terminal of switch 218 receives h, and a second control terminal of switch 218 receives hb (the inverse of h). A second terminal of switch 218 is coupled to an output of inverter 220. An input of inverter 220 is coupled to an output of inverter 222 which provides an output, Q. Therefore, note that master 202 includes at least one circuit element (e.g. inverter 214) and slave 204 includes at least one circuit element (e.g. inverter 222) which are coupled in series with the input and output nodes (e.g. corresponding to D and Q, respectively) of flip-flop 200. That is, each of the at least one circuit elements of master 202 and slave 204 are in a data path from an input to an output of flip-flop 200.

Flip-flop 200 also includes a switch controller 206 which receives an sclk (such as sclk 122), a PG signal (such as PG 120), and VDDC (such as VDDC 130), and provides, in one embodiment, e, eb, f, fb, g, gb, h, and hb. In an alternate embodiment, switch controller 206 may provide e, f, g, and h, and eb, fb, gb, and hb can each be obtained by providing e, f, g, and g through an inverter, respectively. Inverters 212 and 214 receive VDD1 and inverters 222 and 220 receive VDD2. Master portion 202 includes switch 210 and inverters 212 and 214, and slave portion 204 includes switch 218 and inverters 220 and 222.

Note that a switch may also be referred to as a transmission gate or a pass gate. If a switch is on or closed (i.e. the pass gate is enabled), then the first and second terminals of the switch are coupled to each other such that the value at one of its terminals is passed to the other of its terminals. If the switch is off or open (i.e. the pass gate disabled), then the first and second terminals of the switch are decoupled from each other such that the value at one of its terminals is not passed to the other. In the illustrated embodiment of FIG. 2, it is assumed that the switches are turned on by asserting e, f, g, and h (and thus deasserting eb, fb, gb, and hb, respectively) and turned off by deasserting e, f, g, and h (and thus asserting eb, fb, gb, and hb, respectively). Therefore, note that in one embodiment, a switch state of a switch refers to whether the switch is on or off (i.e. closed or open, respectively), such that a first switch state may refer to the switch being on or closed and a second switch state may refer to the switch being off or open, or vice versa.

In operation, flip-flop 200 receives an input D, and provides the value of D as the output Q. For example, operation of flip-flop 200 will first be discussed in reference to FIGS. 3 and 6 where it will be assumed that flip-flop 200 is a positive edge flip-flop (with respect to sclk). As illustrated in the table of FIG. 6, where flip-flop 200 is known to be a positive edge flip-flop, VDD1 (in master portion 202) is coupled to VDD (such as VDD 132) and VDD2 (in slave portion 204) is coupled to VDDC (such as VDDC 130). Referring now to FIG. 3, during normal operation, when PG is deasserted (i.e. set to 0), then both VDD1 and VDD2 provide power to the inverters because during normal operation, VDD is coupled to VDDC (via, for example, transistor 104) such that VDD is approximately equal to VDDC. Therefore, when PG is deasserted, flip-flop 200 operates as a normal positive edge flip-flop. That is, when sclk is 0, switches 208 and 218 are on and switches 210 and 216 are off such that the value of D is transmitted through switch 208, via inverter 214, to the first terminal of switch 216. However, since switch 216 is off, this value is not transmitted to the input of inverter 222. The value in slave 204 stored by the latch formed by inverters 220 and 222 with switch 218 being on remains as output Q. When sclk is 1, switches 210 and 216 are on and switches 208 and 218 are off such that the value of D is stored in master 202 by the latch formed by inverters 212 and 214 with switch 210 being on. The value previously at the output of inverter 214 is transmitted via inverter 222 as output Q such that the previous value of D now appears as output Q.

However, when flip-flop 200 is to be power gated (such as in a low power mode or other power managed mode) then sclk is turned off and VDD1 no longer supplies power to inverters 212 and 214 in master 202 since VDD is decoupled from VDDC. In order to retain state, VDD2, which is provided by VDDC, still provides power to inverters 220 and 222 in slave 204. Therefore, referring to FIG. 3, when PG is asserted (set to 1), switches 208 and 218 are on and switches 210 and 216 are off such that the state of flip-flop 200 is maintained in slave 204. In this manner, state is retained in slave 204 (isolated from master 202 by switch 216) while power can be removed from master 202, thus reducing leakage power consumed by flip-flop 200. That is, during power gating, flip-flop 200 expends less power than during normal operation. Also, note that when PG is asserted, sclk is indicated as a "don't care" since it no longer affects operation of flip-flop 200. That is, when PG is asserted, flip-flop 200 operates independently of sclk. Therefore, switch controller 206 may be designed in a variety of different ways to implement the functionality of the table of FIG. 3, where switch controller 206 is powered by VDDC such that it is not powered down during the low power mode.

Operation of flip-flop 200 will now be discussed in reference to FIGS. 4 and 6 where it will be assumed that flip-flop 200 is a negative edge triggered flip-flop (with respect to sclk). Again, flip-flop 200 receives an input D which is eventually provided as output Q. As illustrated in the table of FIG. 6, where flip-flop 200 is known to be a negative edge flip-flop, VDD1 (in master portion 202) is coupled to VDDC (such as VDDC 130) and VDD2 (in slave portion 204) is coupled to VDD (such as VDD 132). Referring now to FIG. 4, during normal operation, when PG is deasserted (i.e. set to 0), both VDD1 and VDD2 provide power to the inverters because during normal operation, VDD is coupled to VDDC (via, for example, transistor 104) such that VDD is approximately equal to VDDC. Therefore, when PG is deasserted, flip-flop 200 operates as a normal negative edge flip-flop. That is, when sclk is 0, switches 210 and 216 are on and switches 208 and 218 are off such that the previous value of D is now stored in master 202 by the latch formed by inverters 212 and 214 with switch 210 being on. The value in master 202, at the output of inverter 214, is also transmitted via switch 216 and provided via inverter 222 as Q. Therefore, the previous value of D is stored in master 202 and provided as output Q. When sclk is 1, switches 210 and 216 are off and switches 208 and 218 are on such that the value of D is transmitted via switch 208 and inverter 214 to the first terminal of switch 216. However, since switch 216 is off, this value is not transmitted through switch 216 to slave 204. Slave 204 continues to store the previous output value of Q in the latch formed by inverters 220 and 222 with switch 218 being on.

However, when flip-flop 200 is to be power gated (such as in a low power mode or other power managed mode) then sclk is turned off and VDD2 no longer supplies power to inverters 220 and 222 in slave 204 since VDD is decoupled from VDDC. In order to retain state, VDD1, which is provided by VDDC, still provides power to inverters 212 and 214 in master 202. Therefore, referring to FIG. 4, when PG is asserted (set to 1), switches 208 and 218 are off and switches 210 and 216 are on such that the state of flip-flop 200 is maintained in master 202. In this manner, state is retained in master 202 (isolated from slave 204 by switch 216) while power can be removed from slave 204, thus reducing leakage power consumed by flip-flop 200. That is, during power gating, flip-flop 200 expends less power than during normal operation. Note that when PG is asserted, sclk is indicated as a "don't care" since it no longer affects operation of flip-flop 200. That is, when PG is asserted, flip-flop 200 operates independently of sclk. Therefore, switch controller 206 for a negative edge flip-flop may be designed in a variety of different ways to implement the functionality of the table of FIG. 4, where switch controller 206 is powered by VDDC such that it is not powered down during the low power mode.

Therefore, as described above, depending on whether the flip-flop is designed as a positive or negative edge flip-flop, the state can be retained in the slave portion or master portion of the flip-flop, respectively. That is, for a positive edge flip-flop, the clock provided to the flip-flop (such as, e.g., sclk) stops in a first state when entering a low power mode (where, for example, this first state may be a logic level zero). In this case, at the point the clock stops, the slave portion of the flip-flop contains the state that is to be retained. Thus the slave portion (e.g. slave 204) receives VDDC. Similarly, for a negative edge flip-flop, the clock provided to the flip-flop (such as, e.g., sclk) stops in a second state when entering a low power mode (where, for example, this second state may correspond to a logic level one). In this case, at the point the clock stops, the master portion of the flip-flop contains the state that is to be retained. Thus, the master portion (e.g. master 202) receives VDDC.

In some cases, it is not known in which state flip-flop 200 will be when the clock is stopped. That is, it is not known in which state the clock provided to the flip-flop (such as, e.g., sclk) will be in when stopped. In these cases, it will not be known which portion (master 202 or slave 204) will be holding the desired state information at the time sclk is stopped. Therefore, operation of flip-flop 200 will be discussed in reference to FIGS. 5 and 6 which illustrates the case where flip-flop 200 is in an unknown state. For example, in the case of a ripple counter, it may be unknown in which state some of the flip-flops are in at the time sclk is stopped; however, it is still desirable to save state information. The ripple counter is only one example of circuitry having an unknown state flip-flop. That is, other types of circuitries may use flip-flops where the state of the flip-flop will be unknown when the sclk is stopped.

In these type of cases, as illustrated in the table of FIG. 6, both VDD1 and VDD2 are provided by VDDC such that power is not removed from either the slave or master portions of flip-flop 200.

For example, referring to FIG. 5, it is assumed that flip-flop 200, during normal operation (when PG is deasserted or set to 0), operates as a positive edge triggered flip-flop as discussed above in reference to FIG. 3. However, note that in alternate embodiments, a flip-flop of unknown state may be a negative edge flip-flop in which, during normal operation, it will operate as a negative edge flip-flop, as discussed above in reference to FIG. 4. When PG is asserted (i.e. set to 1), and sclk turned off, switches 210 and 218 are turned on and switches 208 and 216 are turned off such that state can be retained. That is, with switch 210 being on, master 202 includes a latch formed by inverters 212 and 214. Similarly, with switch 218 being on, slave 204 includes a latch formed by inverters 220 and 222, where slave 204 is isolated from master 202 by switch 216 being off and master 202 is isolated from other inputs by switch 208 being off. Furthermore, power is not removed from any of inverters 212, 214, 220, and 222. In this manner, regardless of which state flip-flop 200 is in, the state is retained. That is, regardless of whether master 202 or slave 204 currently holds the state of flip-flop 200 when sclk is turned off, the state is saved because the current state of both master 202 and slave 204 is saved. Therefore, for these cases, switch controller 206 can be designed using any type of circuitry to implement the functionality of the table of FIG. 5.

Therefore, it can be appreciated how the use of a modified state retention flip-flop such as flip-flop 200 may be used to retain state and reduce leakage power. Depending on the type of flip-flop in a design (positive edge, negative edge, or whether it will be in an known state), VDD and VDDC can be used appropriately. In some cases, VDDC will only be provided to one of the master or slave portions, and in other cases, VDDC may be provided to both master and slave portions. Note also that in the illustrated embodiment, flip-flop 200 includes two series coupled latches (e.g. master 202 and slave 204) which are capable of retaining state and reducing or inhibiting power loss without the need for additional latches.

Alternate embodiments may use the switches and power supplies differently, as needed. For example, for testing purposes, one embodiment may use a testing mode, indicated to switch controller 206 via, for example, a test mode signal (not shown). When the test mode signal is asserted, switch controller may turn on switches 208 and 216 and turn off switches 210 and 218 such that the input D is routed directly to output Q without being stored in any latches. Also, note that in alternate embodiments, flip-flop 200 may be designed differently. For example, in one embodiment, switch 210 and inverter 212 may be implemented as a tri-state inverter (also referred to as a tristatable inverter) where when switch 210 is to be enabled, the tri-state inverter will operate as an inverter, outputting a 1 or 0 based on its input, and when switch 210 is to be disabled, the output of the tri-state inverter will be a high impedance (corresponding to switch 210 being off). The same modification can be made to inverter 220 and switch 218. Also, other types of circuitry or elements may be used to implement switches 208, 210, 216, and 218. That is, in the illustrated embodiment, they are implemented as pass gates having an NMOS and PMOS transistor coupled together. However, in alternate embodiments, they may be implemented differently.

Therefore, in one embodiment, a state-retentive flip-flop includes input and output nodes and two latches. The two latches include a master latch and a slave latch, each including a circuit element coupled in series with the input and output nodes, a first one of the latches being configured to retain a state of the flip-flop during a power managed mode in which power is decoupled from a second one of the latches. In another embodiment, a state-retentive flip-flop includes input and output nodes and two latches. The two latches include a master latch and a slave latch, each including a circuit element coupled in series with the input and output nodes, a first one of the latches being coupled to operate using a first power supply signal and a second one of the latches being coupled to operate using a second power supply signal, the second power supply signal being a controllably regulated power supply signal. In yet another embodiment, a state-retentive slip-flop includes an input node, an output node, a master including a plurality of circuit elements, and a slave including a plurality of circuit elements, where the input node, the at least one circuit element of the master, the at least one circuit element of the slave, and the output node are coupled in series, and where at least a first circuit element from at least one of the master and the slave is configured to receive power during a power managed mode in which power is decoupled from at least a second circuit element from at least one of the master and the slave. In yet another alternate embodiment, a circuit includes a state-retentive flip-flop which includes a data path from an input to an output, a master loop circuit having a first circuit element in the data path and coupled to receive data from the input, a slave loop circuit having a second circuit element in the data path and coupled to receive data from the first circuit element and to provide data to the output, and state retention control means. The state retention control means includes means for enabling the master loop circuit to retain a state of the flip-flop, means for enabling the slave loop circuit to retain a state of the flip-flop, or means for enabling both the master and the slave loop circuits to retain a state of the flip-flop.

FIG. 7 illustrates an example of a state retention buffer 300 in accordance with one embodiment of the present invention. State retention buffer 300, in response to PG 120, is able to be power gated in order to reduce leakage power while retaining the current state. State retention buffer 300 receives an input A (which may also be referred to as a buffer data input) and provides an output Y (which may also be referred to as a buffer data output). State retention buffer 300 includes an inverter 302 having an input to receive A and an output coupled to an input of an inverter 304 and an output of an inverter 306. An output of inverter 304 provides output Y and is coupled to an input of inverter 306. An inverted enable input of inverter 302 is coupled to receive PG (such as, for example, PG 120) and is coupled to an input of an inverter 308. An output of inverter 308 is coupled to an inverted enable input of inverter 306. Inverter 302 receives VDD, and inverters 304, 306, and 308 receive VDDC. Therefore, a first buffer portion (e.g. inverter 302) receives a first power supply signal (e.g. VDD) while a second buffer portion (e.g. inverters 304, 306, and 308) receives a second power supply signal (e.g. VDDC).

Operation of state retention buffer 300 will be described in reference to the table of FIG. 8. During normal operation, when PG is deasserted, when a 1 is received as the input A, then 1 is provided as the output Y. Similarly, when 0 is received as the input A, then 0 is provided as the output Y. That is, referring to FIG. 7, when PG is deasserted (i.e. a logic level 0), then inverter 302 is enabled while inverter 306 is disabled. In this manner, the input A is provided via inverters 302 and 304 (also referred to as data path inverters) to provide output Y. Also, when PG is deasserted, all inverters 302, 304, 308, and 306 are powered since VDD is coupled to VDDC (via, for example, transistor 104 of FIG. 1) and is therefore approximately equal to VDDC. However, when PG is asserted (i.e. set to a logic level 1) for power gating, such as during a low power mode, then the output Y retains its state (and input A can be treated as a "don't care" since it no longer affects operation of state retention buffer 300). That is, whatever Y is at the time PG is asserted, then Y remains at this value. Referring to FIG. 7, when PG is asserted (i.e. a logic level one), inverter 302 is disabled and inverter 306 is enabled. Also, once PG is asserted, VDD can be decoupled from VDDC, such that only inverters 304, 306, and 308 remain powered. Therefore, inverter 302 no longer receives power, thus reducing leakage power. While PG is asserted, the value at output Y is maintained by the latch formed by inverters 304 and 306. Note also that inverter 308, coupled between the inverted enable inputs of inverters 302 and 306, ensure that inverters 302 and 306 are not enabled at the same time, to prevent data contention issues at the output of inverter 302. However, in alternate embodiments, inverter 308 may not be present, or other circuitry may be used to prevent data contention. Therefore, note that state retention buffer 300 may be used to maintain the state of output Y during power gating. Note also that the state of output Y need not be known. That is, regardless of whether output Y is a 0 or 1 during power gating, the state is maintained since output Y is simply fed back, via inverter 306, to the input of inverter 304.

FIG. 9 illustrates a state retention buffer 400 in accordance with another embodiment of the present invention. State retention buffer 400 is similar to state retention buffer 300; however, it may be used when the state to be maintained is known. State retention buffer 400 receives an input A (which may also be referred to as a buffer data input) and provides an output Y (which may also be referred to as a buffer data output). State retention buffer 400 includes an inverter 402 having an input to receive A and an output coupled to an input of an inverter 404 and an output of an inverter 406. An output of inverter 404 provides output Y. An input of inverter 306 receives a state retention input S. An inverted enable input of inverter 402 is coupled to receive PG (such as, for example, PG 120) and is coupled to an input of an inverter 408. An output of inverter 408 is coupled to an inverted enable input of inverter 406. Inverter 402 receives VDD, and inverters 404, 406, and 408 receive VDDC. Therefore, a first buffer portion (e.g. inverter 402) receives a first power supply signal (e.g. VCC) while a second buffer portion (e.g. inverters 404, 406, and 408) receives a second power supply signal (e.g. VDDC).

Operation of state retention buffer 400 will be described in reference to the table of FIG. 10. During normal operation, when PG is deasserted, when a 1 is received as the input A, then 1 is provided as the output Y. Similarly, when 0 is received as the input A, then 0 is provided as the output Y. That is, referring to FIG. 9, when PG is deasserted (i.e. a logic level 0), then inverter 402 is enabled while inverter 406 is disabled. In this manner, the input A is provided via inverters 402 and 404 (also referred to as data path inverters) to provide output Y. Also, when PG is deasserted, all inverters 402, 404, 408, and 406 are powered since VDD is coupled to VDDC (via, for example, transistor 104 of FIG. 1) and is therefore approximately equal to VDDC. Note that when PG is deasserted, the state retention input S is treated as a "don't care," in that it does not affect operation of state retention buffer 400 when PG is not asserted.

However, when PG is asserted (i.e. set to a logic level 1) for power gating, such as during a low power mode, then the state is retained by providing state retention input S as output Y (and A may treated as a "don't care" since it no longer affects operation of state retention buffer 400). Therefore, in this embodiment, S can be set to whatever value is desired at the output of state retention buffer 400 during power gating. For example, if it is known what the state of retention buffer 400 will be when PG is asserted, then S can be set accordingly such that it is provided as output Y during power gating. In this manner, the state circuitry (such as, e.g., inverter 406) sets a state of the buffer responsive to receiving S and the inverted power gate indicator signal (e.g. PG). In one embodiment, S is hardwired, such as, for example, via a transistor, to provide a logic level 1 or 0 to the input of inverter 406. Alternatively, S may be a programmable value set by software (such as corresponding to a stored bit) or hardware (such as via programmable fuses).

Therefore, referring to FIG. 9, when PG is asserted (i.e. a logic level one), inverter 402 is disabled and inverter 406 is enabled. Also, once PG is asserted, VDD can be decoupled from VDDC, such that only inverters 404, 406, and 408 remain powered. Therefore, inverter 402 no longer receives power, thus reducing leakage power. While PG is asserted, the value at output Y is provided by state retention in put S via inverters 406 and 404. Note also that inverter 408, coupled between the inverted enable inputs of inverters 402 and 406, ensure that inverters 402 and 406 are not enabled at the same time, to prevent data contention issues at the output of inverter 402. However, in alternate embodiments, inverter 408 may not be present, or other circuitry may be used to prevent data contention. Therefore, note that state retention buffer 400 may be used to maintain the state of output Y during power gating with the use of state retention input S, such as when the state of output Y is known.

FIG. 14 illustrates a state retention buffer 500 in accordance with another embodiment of the present invention. State retention buffer 500 may be used when the state to be maintained is known to be a logic level zero, and thus a hardwired pull-up transistor may be used to maintain the state. State retention buffer 500 receives an input A (which may also be referred to as a buffer data input) and provides an output Y (which may also be referred to as a buffer data output). State retention buffer 500 includes an inverter 502 having an input to receive A and an output coupled to an input of an inverter 504. An output of inverter 504 provides output Y. An inverted enable input of inverter 502 is coupled to receive PG (such as, for example, PG 120) and is coupled to an input of an inverter 508. State retention buffer 500 also includes a pull-up transistor 510 having a first current electrode (also referred to as a first current handling terminal) coupled to the input of inverter 504 and a second current electrode (also referred to a second current handling terminal) coupled to VDDC. An output of inverter 508 is coupled to a control electrode (also referred to as a control terminal) of pull-up transistor 510. Inverter 402 receives VDD, and inverters 504 and 408 receive VDDC. Therefore, a first buffer portion (e.g. inverter 502) receives a first power supply signal (e.g. VCC) while a second buffer portion (e.g. inverters 404 and 408) receives a second power supply signal (e.g. VDDC). Also, note that in this embodiment, the second current electrode of transistor 510 is coupled to a state retention input S, which, in this embodiment, corresponds to VDDC.

Operation of state retention buffer 500 will be described in reference to the table of FIG. 15. During normal operation, when PG is deasserted, when a 1 is received as the input A, then 1 is provided as the output Y. Similarly, when 0 is received as the input A, then 0 is provided as the output Y. That is, referring to FIG. 14, when PG is deasserted (i.e. a logic level 0), then inverter 502 is enabled and pull-up transistor 510 is off (since the value at its control electrode is a logic level 1). In this manner, the input A is provided via inverters 502 and 504 (also referred to as data path inverters) to provide output Y. Also, when PG is deasserted, all inverters 502, 504, and 508 are powered since VDD is coupled to VDDC (via, for example, transistor 104 of FIG. 1) and is therefore approximately equal to VDDC.

However, when PG is asserted (i.e. set to a logic level 1) for power gating, such as during a low power mode, then the state is retained by pull-up transistor 510. That is, when PG is asserted, pull-up transistor 510 is on, thus coupling the input to inverter 504 to VDDC, thus pulling it up to a logic level 1. Therefore, the output of inverter 504 is maintained at a logic level 0. In this manner, the state circuitry (including, e.g., pull-up transistor 510) sets a state of the buffer responsive to receiving a state retention input (e.g. VDDC which is coupled to the second current electrode of transistor 510) and the inverted power gate indicator signal (e.g. PG). Therefore, referring to FIG. 14, when PG is asserted (i.e. a logic level one), inverter 502 is disabled and inverter 506 is enabled. Also, once PG is asserted, VDD can be decoupled from VDDC, such that only inverters 504 and 508 remain powered. Therefore, inverter 502 no longer receives power, thus reducing leakage power.

FIG. 16 illustrates a state retention buffer 600 in accordance with another embodiment of the present invention. State retention buffer 600 may be used when the state to be maintained is known to be a logic level one, and thus a hardwired pull-down transistor may be used to maintain the state. State retention buffer 600 receives an input A (which may also be referred to as a buffer data input) and provides an output Y (which may also be referred to as a buffer data output). State retention buffer 600 includes an inverter 602 having an input to receive A and an output coupled to an input of an inverter 604. An output of inverter 604 provides output Y. An inverted enable input of inverter 602 is coupled to receive PG (such as, for example, PG 120). State retention buffer 500 also includes a pull-down transistor 610 having a first current electrode (also referred to as a first current handling terminal) coupled to the input of inverter 604 and a second current electrode (also referred to a second current handling terminal) coupled to a ground potential (GND). PG (such as, for example, PG 120) is also provided to a control electrode (also referred to as a control terminal) of pull-down transistor 610. Inverter 502 receives VDD, and inverter 604 receives VDDC. Therefore, a first buffer portion (e.g. inverter 602) receives a first power supply signal (e.g. VCC) while a second buffer portion (e.g. inverter 604) receives a second power supply signal (e.g. VDDC). Also, note that in this embodiment, the second current electrode of transistor 610 is coupled to a state retention input S, which, in this embodiment, corresponds to GND.

Operation of state retention buffer 600 will be described in reference to the table of FIG. 17. During normal operation, when PG is deasserted, when a 1 is received as the input A, then 1 is provided as the output Y. Similarly, when 0 is received as the input A, then 0 is provided as the output Y. That is, referring to FIG. 16, when PG is deasserted (i.e. a logic level 0), then inverter 602 is enabled and pull-down transistor 610 is off (since the value at its control electrode is a logic level 0). In this manner, the input A is provided via inverters 602 and 604 (also referred to as data path inverters) to provide output Y. Also, when PG is deasserted, all inverters 602, 604, and 608 are powered since VDD is coupled to VDDC (via, for example, transistor 104 of FIG. 1) and is therefore approximately equal to VDDC.

However, when PG is asserted (i.e. set to a logic level 1) for power gating, such as during a low power mode, then the state is retained by pull-down transistor 610. That is, when PG is asserted, pull-down transistor 610 is on, thus coupling the input to inverter 604 to GND, thus pulling it down to a logic level 0. Therefore, the output of inverter 604 is maintained at a logic level 1. In this manner, the state circuitry (including, e.g., pull-down transistor 610) sets a state of the buffer responsive to receiving a state retention input (e.g. GND which is coupled to the second current electrode of transistor 610) and the power gate indicator signal (e.g. PG). Therefore, referring to FIG. 16, when PG is asserted (i.e. a logic level one), inverter 602 is disabled and inverter 606 is enabled. Also, once PG is asserted, VDD can be decoupled from VDDC, such that only inverter 604 remains powered. Therefore, inverter 602 no longer receives power, thus reducing leakage power.

As can be appreciated by the various examples provided in FIGS. 7–10 and FIGS. 14017, any type of state setting circuitry may be used for setting a state of the buffer in response to receiving a state retention signal S at a state retention data input and a power gate indicator signal. That is, alternate embodiments may use different types of circuitries to provide state retention for buffers where different portions of the buffer may receive different power supply signals (such as, e.g., VDD and VDDC) so as to reduce leakage power during low power modes.

Therefore, in one embodiment, a buffer includes a first buffer portion coupled to receive a first power supply signal and a second buffer portion coupled to receive a second power supply signal. The first buffer portion includes a buffer data input and the second buffer portion includes a buffer data output, wherein one of the first and second power supply signals is configured to be selectively enabled independently from the other of the first and second power supply signals. In this embodiment, each of the first and second buffer portions may include a data path portion coupled in series between the buffer data input and buffer data output, and one of the first or second buffer portions may include a feedback portion which enables buffer state retention during a power saving mode. In another embodiment, a circuit includes a first power supply signal, a gate circuit coupled to receive and gate the first power supply signal to controllably provide a second power supply signal, and a plurality of buffer cells. Each buffer cell includes a buffer input, a buffer output, an inverter having an inverter input coupled to the buffer input and coupled to receive the first power supply, and a latch having a latch input coupled to an inverter output and a latch output coupled to the buffer output. The latch is coupled to receive the second power supply. In yet another embodiment, a method for retaining a state of a circuit through a power saving mode of the circuit includes providing a first buffer portion coupled to receive a first power signal, the first buffer portion including a buffer input. The method also includes providing a second buffer portion coupled to receive a second power signal, the second buffer portion including a buffer output. The method further includes supplying the first power signal to the first buffer portion, supplying the second power signal to the second buffer portion, disabling the first power signal to the first buffer portion, and storing a buffer state in the second buffer portion while the first power signal is disabled. In yet another alternate embodiment, a method for operating a single bit buffer cell includes supplying power to a first portion of a buffer, supplying power to a second portion of the buffer, and disabling power to the first portion of the buffer while power is supplied to the second portion of the buffer.

Figure 11:
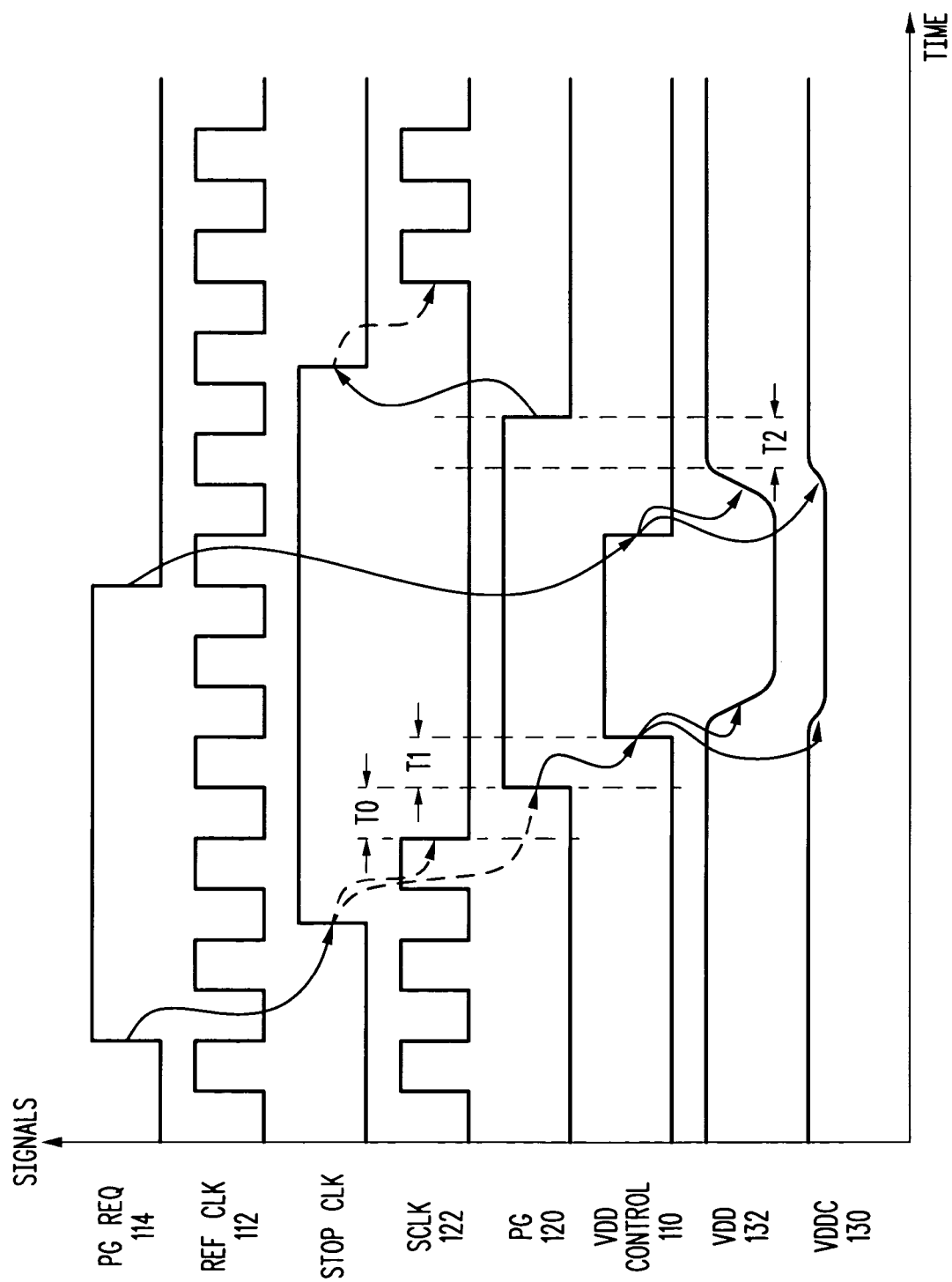
FIGS. 11 and 12 illustrate timing diagrams illustrating operation of the data processing system of FIG. 1, in accordance with various embodiments of the present invention.
Figure 12:
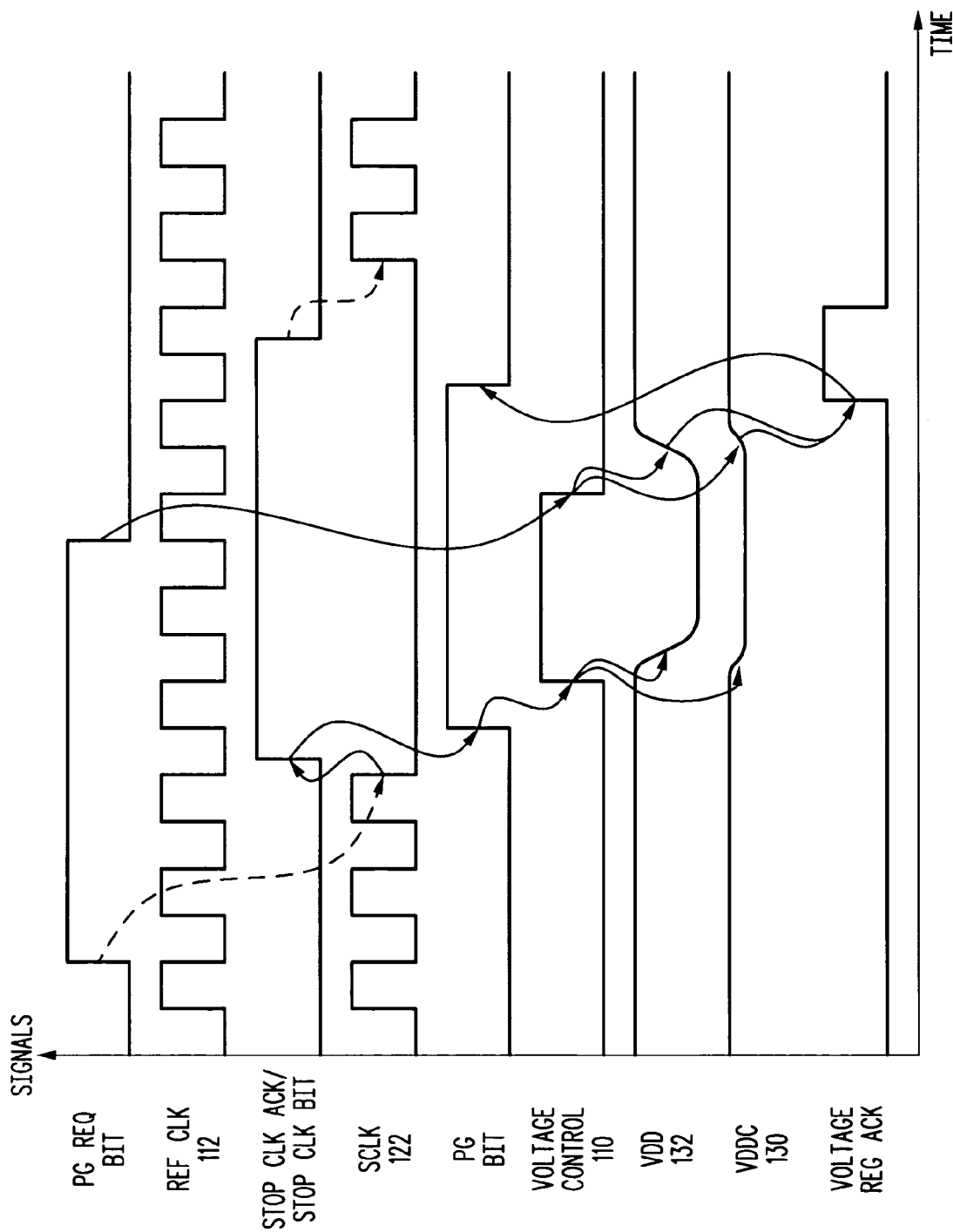
Figure 13:
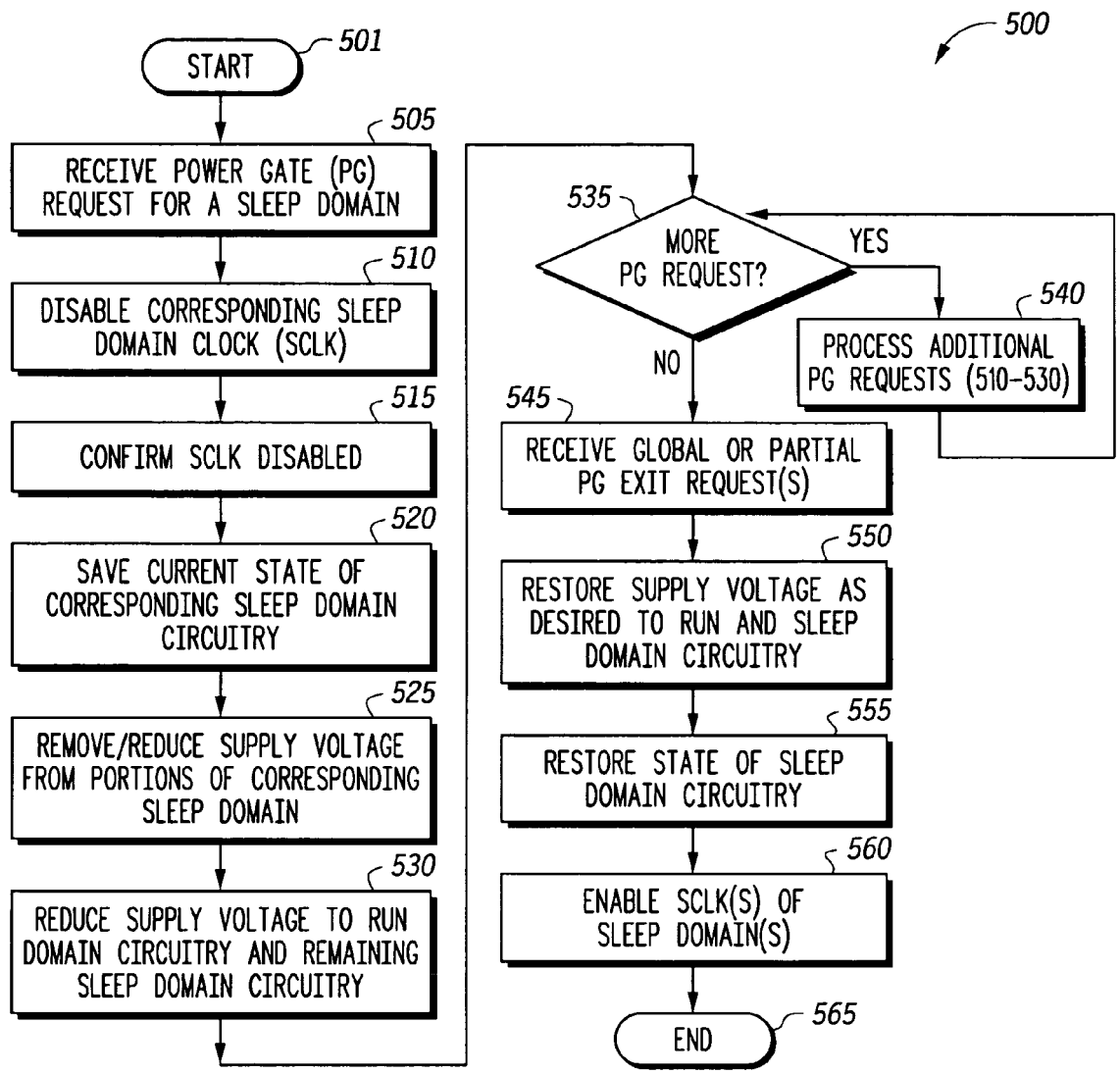
FIG. 13 illustrates, in flow diagram form, a method for state retention, in accordance with one embodiment of the present invention.

Operation of sate retention controller and the timing of signals in accordance with various embodiments of the present invention will be described in reference to FIGS. 11–13. FIG. 13 illustrates a flow 500 describing operation of data processing system 100 of FIG. 1 in accordance with one embodiment of the present invention. FIG. 11 illustrates a timing diagram corresponding to one embodiment of a hardware implementation and FIG. 12 illustrates a timing diagram corresponding to one embodiment of a software implementation. (Note that the signals illustrated in FIGS. 11 and 12 are implemented as positive logic signals, but in an alternate embodiment, any of the signals may be implemented as negative logic signals.) Therefore, first the flow of FIG. 13 will be described in reference to data processing system of FIG. 1.

Referring to FIG. 13, flow 500 begins with start 501 and flow then proceeds to block 505 where a power gate (PG) request for a sleep domain is received. For example, referring to FIG. 1, this may correspond to state retention controller 118 receiving PG req 114. In one embodiment, PG req 114 may correspond to all of sleep domain functional circuitry 124, such that when a PG request is received via PG req 114, all of sleep domain functional circuitry 124 is power gated. (In this embodiment, note that the PG request may be referred to as a global PG request.) However, in alternate embodiments, PG requests may be received via PG req 114 corresponding to portions of sleep domain functional circuitry 124 or to other portions of sleep domain functional circuitry elsewhere within data processing system 100 that may be independently power gated. (In these embodiments, note that the PG requests may also be referred to as partial PG requests.) For example, each PG request received via PG req 114 may also include an indication of which sleep domain is to be power gated (where the sleep domain to be power gated may be, for example, a portion of sleep domain functional circuitry 124). Also, in this embodiment having multiple portions that may be independently power gated, each portion may receive a corresponding sclk 122 from clock controller 116, a corresponding PG 120 from state retention controller 118, and a corresponding VDD 132 derived from VDDC 130. However, for ease of explanation herein, it will be assumed that a request received via PG req 114 indicates that all of sleep domain functional circuitry 124 is to be power gated. Therefore, sclk 122, PG 120, and VDD 132 are all provided to sleep domain functional circuitry 124.

Referring back to FIG. 13, after receiving a PG request, flow proceeds to block 510 where the corresponding sleep domain clock (sclk) is disabled. Therefore, referring to FIG. 1, state retention controller 118, upon receiving a PG request via PG req 114, may communicate with clock controller 116 via clk control signals 134 so that clock controller 116 may disable sclk 122. Sclk 122 is therefore disabled for all of sleep domain functional circuitry 124. (However, note that in alternate embodiments, as described above, sclk 122 may be disabled only for those portions of sleep domain functional circuitry 124 to be power gated. In this embodiment, data processing system 100 may designed such that a sleep domain clock such as sclk 122 may be separately provided to those portions to be independently power gated.) Referring back to FIG. 13, flow then proceeds to block 515 where it is confirmed that sclk is disabled. Therefore, in one embodiment, clock controller 116 may provide confirmation to state retention controller 118 that sclk 122 has been disabled.

After block 515 of FIG. 13, flow proceeds to block 520 where the current state of corresponding sleep domain circuitry is saved. For example, the sleep domain functional circuitry 124 may include state retention flip-flops and buffers like those described in reference to FIGS. 2, 7, 9, 14, and 16. Therefore, state retention controller 118 may assert PG 120, where, in response to PG 120, state is maintained. For example, the state retention flip-flops and buffers respond to PG 120 to save state as was described above in reference to flip-flop 200 and buffers 300 and 400 in FIGS. 2, 7, 9, 14, and 16. (Note that in alternate embodiments, as described above, PG 120 may be asserted only for those portions of sleep domain functional circuitry 124 that are to be power gated, as indicated, for example, by PG req 114. In this embodiment, data processing system 100 may be designed such that a separate PG signal such as PG 120 may be provided to those portions to be independently power gated.)

After block 520 of FIG. 13, flow proceeds to block 525 where the supply voltage may be removed or reduced from portions of corresponding sleep domain circuitry. In the example of FIG. 1, where it is assumed that a PG request via PG req 114 corresponds to all of sleep domain functional circuitry 124, state retention controller 118 may assert VDD control 110 (i.e. setting VDD control 110 to a logic level 1) to decouple VDD 132 from VDDC 130 such that those circuit portions powered by VDD 132 no longer receive power. For example, as was described above in reference to flip-flop 200 and buffers 300 and 400, power is removed from those circuit elements powered by VDD (while those powered by VDDC remain powered, in order to retain state). Note that during normal or full power operation, state retention controller 118 may keep VDD control 110 deasserted so as to allow VDD 132 to be coupled to VDDC 130 via transistor 104 such that VDD 132 is approximately equal to VDDC 130. Note that in alternate embodiments, data processing system 100 may be designed differently such that VDD 132 is not decoupled from VDDC 132 in order to remove power, but instead, VDD 132 may be reduced. For example, in one embodiment, VDD 132 may not be coupled to VDDC 130 via transistor 104, but may instead be coupled to another voltage regulator (not shown) within data processing system 100 which supplies the power for VDD 132. In this embodiment, the voltage regulator coupled to VDD 132 can, based on control signals from state retention controller 118, reduce the voltage supplied by VDD 132 in order to reduce leakage power.

After block 525 of FIG. 13, flow proceeds to block 530 where the supply voltage to run domain circuitry and remaining sleep domain circuitry is reduced. For example, referring to the data processing system of FIG. 1, VDDC 130 may be reduced by voltage regulator 102 such that more power is conserved. Therefore, all the circuitry of sleep domain functional circuitry 124 powered by VDDC 130 and the circuitry of running domain functional circuitry 128 powered by VDDC 130 may run at reduced power during power gating. However, note that in alternate embodiments, this is optional. That is, in one embodiment, during power gating, VDDC 130 remains at the same power level.

Referring back to FIG. 13, flow then proceeds to decision diamond 535 where it is determined whether more PG requests are received. If so, then flow proceeds to block 540 where the additional PG requests are processed using the processes of blocks 510–530, as was described above. Flow then returns to decision diamond 535. However, if at decision diamond 535 no more PG requests are received, flow proceeds to block 545 where a global or partial PG exit request is received. For example, in the example of FIG. 1, a global PG exit request may be indicated via PG req 114 (such as by the deassertion of PG req 114). In alternate embodiments having circuitry portions that may be independently power gated, a partial PG exit request corresponding to one or more of these portions may be received. For example, they may also be received via PG req 114 along with an indication as to which portions are to no longer be power gated.

After block 545, flow proceeds to block 550 where the supply voltage is restored as desired to run and sleep domain circuitry. For example, state retention controller 118 may deassert VDD control 110 such that VDD 132 may again be coupled to VDDC 130, thus restoring power to those elements powered by VDD 132. Similarly, if VDD 132 was reduced, it can be returned to full power. Also, if VDDC 130 was reduced, it can be returned to full power. Alternatively, data processing system 100 may remain in a low power mode with reduced power even if no power gating is desired. In this embodiment, the supply voltages VDDC 130 and VDD 132 may not be restored (that is, block 550 is optional).

Flow 500 then proceeds to block 555 where the state of sleep domain circuitry is restored. That is, once the supply voltages have been restored, as desired, the state may be restored. For example, in data processing system 100, once VDD control 110 is deasserted to restore VDD 132 and VDDC 130, state retention controller 118 may deassert PG 120 so that state may be restored, as was described above in reference to flip-flop 200 and buffers 300 and 400. Flow then proceeds to block 560 where the sclks of the corresponding sleep domains that are to exit power gating are enabled. Therefore, in data processing system 100, once PG 120 is deasserted, state retention controller 118 may indicate to clock controller 116 that sclk 122 can be re-enabled. Flow then proceeds to end 565.

FIG. 11 illustrates a timing diagram illustrated the timing of signals in accordance with one embodiment of the present invention. For example, the timing diagram of FIG. 11 may correspond to a hardware implementation of achieving the power gating described in reference to FIG. 13. In response to PG req 114 being asserted (assuming again that it is a global PG request for all of sleep domain functional circuitry 124), a stop clock signal may be asserted (for example, by state retention controller 118, via clk control signal 134), as indicated by the arrow from the rising edge of PG req 114 to the rising edge of stop clk in FIG. 11. In response to the stop clk signal, clock controller 116 may disable sclk 122. This may be done upon receiving the asserted stop clk signal, or at some predetermined time afterwards to ensure that the clock is appropriately disabled. State retention controller 118, at some time T0 after sclk 122 is disabled, may assert PG 120. In one embodiment, state retention controller 118 may receive a signal from clock controller 116 via clk control signals 134 that indicates that sclk 122 has been disabled, and state retention controller may assert PG 120 in response to this signal. However, in an alternate embodiment, as indicated by the dotted arrow from the rising edge of stop clk to the time PG 120 is asserted, state retention controller 118 may assert PG 120 a predetermined amount of time after asserting stop clk. The predetermined amount of time may be designed such that it ensures that a sufficient amount of time passes between the disabling of sclk 122 and the assertion of PG 120, as needed. In some embodiments, T0 may be 0, while in other embodiments, T0 may be longer.

After assertion of PG 120, state retention controller 118 asserts VDD control 110 in order to remove power supplied by VDD 132. In one embodiment, state retention controller 118 waits a predetermined amount of time after assertion of PG 120 before asserted VDD control 110. The predetermined amount of time may be designed so as to ensure that a sufficient amount of time, T1, has passed to allow the assertion of PG 120 to properly propagate to all circuit elements before the supply power is removed or reduced. Otherwise, if the supply power is removed or reduced before the assertion of PG 120 is received, state may not properly be saved (as can be seen with the examples of flip-flop 200 and buffers 300, 400, 500, and 600 described above). After T1, VDD control 110 is asserted and at some time later, VDD 132 drops to a level of 0V (as indicated by the arrow from the rising edge of VDD control 110 and the falling edge of VDD 132). In an alternate embodiments, VDD 132 may be reduced rather than dropped all the way to 0V. Also, in one embodiment, as illustrated in FIG. 11, VDD 130 may also be reduced in response to the assertion of VDD control 110 (as indicated by the arrow from the rising edge of VDD control 110 to the falling edge of VDD 130). However, in alternate embodiments, VDDC 130 may be reduced in response to the falling edge of VDD 132 or may not be reduced at all. At this point, data processing system 100 is power gated and operating in a low power mode.

Upon deassertion of PG req 114, state retention controller 118 deasserts VDD control 110 which allows VDD 132 and VDDC 130 to be restored. A predetermined amount of time after deassertion of VDD control 110, state retention controller 118 asserts PG 120. The predetermined amount of time may ensure that a sufficient amount of time, T2, has passed between the restoration of the supply voltages and the deassertion of PG 120 in order to ensure that supply voltage is restored before restoring state. After deassertion of PG 120, state retention controller 118 deasserts the stop clk signal, via clk control signals 134, so that clock controller 116 may re-enable sclk 122. Therefore, at some time after receiving the stop clk signal, clock controller re-enables sclk 122, as illustrated by the dotted arrow from the falling edge of stop clk to a rising edge of sclk 122 in FIG. 11.

Note that in the embodiment of FIG. 11, PG req 114 may be generated in a variety of different ways. For example, it may be provided by a power management unit (not shown) or by other circuitry internal or external to data processing system 100. In one embodiment, PG req 114 may be received based on a bit stored within memory, programmable via software running on data processing system 100. Alternatively, PG req 114 may itself correspond to a bit or bits in storage circuitry within data processing system 100 that are software controllable. The timing diagram of FIG. 12 illustrates an example in which a software bit or bits may be used as PG req 114. Note that software may be used to implement the timing diagram of FIG. 12, where the software may be located in memory within data processing system 100 and executed by a processor portion. For example, the software may be executed by circuitry within running domain functional circuitry 128, and may be stored in memory located anywhere within data processing system 100. Alternatively, the software may be executed by circuitry within state retention controller 118.

Referring to the timing diagram of FIG. 12, a PG request may be received by asserting, for example, a PG req bit (in this example, it is again assumed that the PG request is a global PG request for all of sleep domain function circuitry 124). After assertion of this bit, software may be used to indicate to clock controller 116 that sclk 122 is to be disabled, as indicated by the dotted arrow from the assertion of PG req bit and the disabling of sclk 122. In response to disabling sclk 122, a stop clock acknowledge (stop clk ack) bit or bits may be asserted to indicate that sclk 122 has been disabled. In response to the stop clk ack signal, the PG bit (which may be stored in storage circuitry somewhere within data processing system 100) may be asserted to indicate that power gating is to be performed. State retention controller 118 may then assert voltage control 110 to remove or reduce VDD 132 and to reduce, if desired, VDDC 130, as was described above in reference to FIG. 11. Note that in an alternate embodiment, software stored within data processing system 100 may control VDD control 110 by detecting when the PG bit is asserted and, in response, asserting VDD control 10 which may also be a bit or bits stored in memory. At this point, data processing system 100 is power gated and operating in a low power mode.

Upon deassertion of PG req bit, VDD control 110 is deasserted (by software or by hardware within state retention controller 118) which allows VDD 132 and VDDC 130 to be restored. Upon VDD 132 and VDDC 130 being restored, a voltage regulator acknowledge (voltage reg ack) signal may be generated (for example, by voltage regulator 102) to indicate that the voltages have been restored. Software may detect the generation of the voltage regulator ack and deassert the PG bit to begin exiting out of power gating. In one embodiment, the voltage reg ack is also represented by a bit or bits stored within data processing system 100. After deassertion of the PG bit, the stop clk ack signal can be deasserted to indicate a "resume clock request" to clock controller 116. Therefore, in one embodiment, the stop clk ack is a bit (or bits) stored within data processing system 100 that, when asserted, indicates that sclk 122 has been stopped, and when deasserted, operates as a request to re-enable sclk 122. Clock controller 116 then re-enables sclk 122, and data processing system 100 may resume normal or full power operation.

Therefore, note that the flow of FIG. 13 may be implemented in hardware, software, or by a combination of hardware and software. Data processing system 100 may therefore include state retention circuitry such as state retention flip-flop 200 and state retention buffers 300 and 400 which may power gated in order to reduce leakage power while saving state information. Furthermore, data processing system 100 be designed in a variety of different ways to properly control the PG signals, sclks, and supply voltages (e.g. VDD and VDDC) provided to the state retention flip-flops and buffers. That is, the flow diagram of FIG. 13 and timing diagrams of FIGS. 11 and 12 are only examples of how to properly control signals within data processing system 100 to allow for power gating.

Therefore, in one embodiment, a method of reducing power loss in an information processing system having running domain circuitry and sleep domain circuitry includes receiving a power gate request for diminishing power loss in the information processing system, disabling a sleep domain clock coupled to the sleep domain circuitry, saving a current state of corresponding sleep domain circuitry in at least one of two series coupled latches in each flip-flop of the sleep domain circuitry, and regulating a supply voltage from at least a portion of sleep domain circuitry corresponding to the power gate request.

In one embodiment, a circuit includes a gate circuit for receiving a continuous power supply signal and generating a gatable power supply signal, a run domain flip-flop coupled to receive the continuous power supply signal, and a sleep domain state-retentive flip-flop coupled to receive the continuous power supply signal and the gatable power supply signal where the sleep domain state-retentive flip-flop retains a preexisting state while decoupling power to a portion of the sleep domain state-retentive flip-flop.

In the foregoing specification, the invention has been described with reference to specific embodiments. However, one of ordinary skill in the art appreciates that various modifications and changes can be made without departing from the scope of the present invention as set forth in the claims below. For example, any software taught herein may be embodied on one or more of computer hard disks, floppy disks, 3.5" disks, computer storage tapes, magnetic drums, random access memory (RAM) cells, static random access memory (SRAM) cells, dynamic random access memory (DRAM) cells, synchronous dynamic random access memory (SDRAM) cells, electrically erasable (EEPROM, EPROM, flash) cells, nonvolatile cells, ferroelectric or ferromagnetic memory, compact disks (CDs), laser disks, optical disks, and any like computer readable media. Also, the block diagrams may include different blocks than those illustrated and may have more or fewer blocks or be arranged differently. Also, the flow diagrams may be arranged differently, include more or fewer steps, or may have steps that can be separated into multiple steps or steps that can be performed simultaneously with one another. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A circuit comprising a state-retentive flip-flop, the flip-flop comprising:

input and output nodes;

two latches, a master latch and a slave latch, each of the latches including a circuit element coupled in series with the input and output nodes, a first one of the latches being configured to retain a state of the flip-flop during a power managed mode in which power is decoupled from a second one of the latches;

a switch controller coupled to receive a clock signal and a power gate indicator signal, the switch controller generating a first set of switch control values dependent upon the clock signal when the power gate indicator signal has a first value and generating a second set of switch control values independent of the clock signal when the power gate indicator signal has a second value;

a first switch coupled between the input node and the master latch; and a second switch coupled between the master latch and the slave latch, wherein the switch controller is coupled to provide switch control signals to the first and second switches;

and wherein:

the master latch includes cross-coupled invertors and a third switch, one of the invertors and the third switch being coupled to the first switch, the third switch being coupled to receive a switch control signal from the switch controller; and the slave latch includes cross-coupled invertors and a fourth switch, one of the invertors of the slave latch and the fourth switch being coupled to the second switch, each of the invertors of the slave latch being coupled to the output node, the fourth switch being coupled to receive a switch control signal from the switch controller, wherein an input of the slave latch located between the second switch and the one of the invertors of the slave latch is not provided as feedback to the master latch during the power managed mode.

2. The circuit of claim 1 wherein:
the switch controller is configured to control the first and fourth switches to a first switch state and the second and third switches to a second switch state responsive to the clock signal having a first value and the power gate indicator signal having a first value;
the switch controller is configured to control the first and fourth switches to the second state and the second and third switches to the first state responsive to the clock signal having a second value and the power gate indicator signal having the first value; and
the switch controller is configured to control the first and second switches to a first state and the third and fourth switches to a second state responsive to the power gate indicator signal having a second value.

3. The circuit of claim 1, the flip-flop further comprising:
a clock signal input node for receiving a clock signal; and
a power gate indicator input node for receiving a power gate indicator signal, the flip-flop operating in a first operational state dependent upon the clock signal when the power gate indicator signal has a first value and operating in a second operational state independent from the clock signal when the power gate indicator signal has a second value, the second operational state retaining the state of the flip-flop while expending less power than the first operational state.

4. The circuit of claim 1, the flip-flop further comprising:
a first power supply node coupled to receive a continuous power supply signal; and
a second power supply node coupled to receive a gated power supply signal.

5. The circuit of claim 4 wherein:
the state-retentive flip-flop is a positive-edge flip-flop;
the slave latch is coupled to receive the continuous power supply signal via the first power supply node; and
the master latch is coupled to receive the gated power supply signal via the second power supply node.

6. The circuit of claim 4 wherein:
the state-retentive flip-flop is a negative-edge flip-flop;
the master latch is coupled to receive the continuous power supply signal via the first power supply node; and
the slave latch is coupled to receive the gated power supply signal via the second power supply node.

7. The circuit of claim 1 wherein
the state-retentive flip-flop is a positive-edge flip-flop;
the first one of the latches is the slave latch; and
the second one of the latches is the master latch.

8. The circuit of claim 7 further comprising a negative edge flip-flop, the negative edge flip-flop comprising:
input and output nodes; and
two latches, a master latch and a slave latch, each of the latches of the negative edge flip-flop including a circuit element coupled in series with the input and output nodes of the negative edge flip-flop, the master latch of the negative edge flip-flop being configured to retain a state of the flip-flop during a power managed mode in which power is decoupled from the slave latch of the negative edge flip-flop.

9. The circuit of claim 1,
the switch controller is configured to control the first and fourth switches to a first switch state and the second and third switches to a second switch state responsive to the clock signal having a first value and the power gate indicator signal having a first value;
the switch controller is configured to control the first and fourth switches to the second state and the second and third switches to the first state responsive to the clock signal having a second value and the power gate indicator signal having the first value; and
the switch controller is configured to control the third and fourth switches to the first switch state and the first and second switches to the second state responsive to the power gate indicator signal having a second value.

10. A circuit comprising a state-retentive flip-flop, the flip-flop comprising:
input and output nodes; and
two latches, a master latch and a slave latch, each of the latches including a circuit element coupled in series with the input and output nodes, a first one of the latches being configured to retain a state of the flip-flop during a power managed mode in which power is decoupled from a second one of the latches;
and wherein the circuit further comprises:
a clock controller coupled to receive a reference clock and to provide a run clock and a sleep clock;
run domain circuitry including a non-state-retentive flip-flop, the non-state-retentive flip-flop being coupled to receive the run clock signal; and
sleep domain circuitry including the state-retentive flip-flop being coupled to receive the sleep clock signal.

11. The circuit of claim 10 further comprising:
a state retention controller coupled to provide a power gate indicator signal to the sleep domain circuitry and to provide a power gate control signal to a power gating switch; and
the power gating switch coupled to receive a continuous power supply signal and to provide a gated power supply signal to the sleep domain circuitry under control of the power gate control signal.

12. A method of reducing power loss in an information processing system having running domain circuitry and sleep domain circuitry, the method comprising:
receiving a power gate request for diminishing power loss in the information processing system;
disabling a sleep domain clock coupled to the sleep domain circuitry
saving a current state of corresponding sleep domain circuitry in at least one of two series coupled latches in each flip-flop of the sleep domain circuitry;
regulating a supply voltage from at least a portion of sleep domain circuitry corresponding to the power gate request,
wherein the step of disabling the sleep domain clock includes confirming that the sleep clock is disabled before regulating the supply voltage of the sleep domain circuitry.

13. The method of claim 12 wherein the power gate request is a partial gate request, and the step of receiving the gate request includes identifying a specific portion of the sleep domain circuitry.

14. The method of claim 12 wherein the step of regulating the supply voltage of the sleep domain circuitry comprises at least one of the following steps:
decoupling power from the sleep domain circuitry; or
reducing power to the sleep domain circuitry.

15. The method of claim 12 further comprising:
receiving an additional power gate request; and
repeating the steps of disabling, confirming and saving responsive to receiving the additional power gate request.

16. The method of claim 12 further comprising:
reducing a supply voltage to the running domain circuitry and any sleep domain circuitry still operating.

17. The method of claim 12 further comprising:
receiving a global or a partial power gate exit request;
restoring the supply voltage to the running domain and sleep domain circuitry;
restoring the state of the sleep domain circuitry; and
enabling the sleep domain clock.

18. The method of claim 12 wherein the step of restoring the state of the sleep domain circuitry includes restoring a higher power level to the sleep domain circuitry and enabling the sleep domain circuitry to operate according to the sleep clock.

19. The method of claim 12 wherein the step of saving the current state of corresponding sleep domain circuitry comprises:
saving the current state in a master latch of each flip-flop for which a received clock signal stops in a first state; and
saving the current state in a slave latch of each flip-flop for which a received clock signal stops in a second state.

20. The method of claim 19 wherein the first state is a logic zero and the second state is a logic one.

* * * * *